(12) United States Patent
Furushima et al.

(10) Patent No.: US 8,253,150 B2
(45) Date of Patent: Aug. 28, 2012

(54) SEMICONDUCTOR LIGHT EMITTING DEVICE AND METHOD OF MANUFACTURING IT

(75) Inventors: Yuji Furushima, Miyagi (JP); Tetsuya Konno, Miyagi (JP); Fujimoto Tsuyoshi, Miyagi (JP)

(73) Assignee: Sony Corporation, Tokyo (JP)

( * ) Notice: Subject to any disclaimer, the term of this patent is extended or adjusted under 35 U.S.C. 154(b) by 465 days.

(21) Appl. No.: 11/975,888

(22) Filed: Oct. 22, 2007

(65) Prior Publication Data

US 2008/0111142 A1    May 15, 2008

(30) Foreign Application Priority Data

Nov. 10, 2006    (JP) ................ P2006-305926

(51) Int. Cl.
*H01L 33/00* (2010.01)

(52) U.S. Cl. ... 257/91; 257/777; 257/700; 257/E33.065; 257/E33.023; 438/33

(58) Field of Classification Search ............... 257/91, 257/E33.065, E33.023, 777, 700; 438/33
See application file for complete search history.

(56) References Cited

U.S. PATENT DOCUMENTS

| | | | | |
|---|---|---|---|---|
| 5,121,457 A | * | 6/1992 | Foley et al. | 385/89 |
| 5,629,233 A | * | 5/1997 | Chand et al. | 438/33 |
| 5,909,524 A | * | 6/1999 | Tabuchi | 385/49 |
| 6,748,001 B1 | * | 6/2004 | Nishitsuka et al. | 372/43.01 |
| 2004/0071176 A1 | * | 4/2004 | Ohta et al. | 372/44 |
| 2004/0114648 A1 | * | 6/2004 | Nagano et al. | 372/36 |
| 2005/0179367 A1 | * | 8/2005 | Krohn et al. | 313/503 |
| 2005/0227458 A1 | * | 10/2005 | Kobayashi et al. | 438/483 |

FOREIGN PATENT DOCUMENTS

| | | |
|---|---|---|
| JP | 11-340587 | 12/1999 |
| JP | 2001-230502 | 8/2001 |
| JP | 2003-124572 | 4/2003 |
| JP | 2005-101044 | 4/2005 |
| JP | 3486900 | 10/2005 |
| JP | 2005-327905 | 11/2005 |

OTHER PUBLICATIONS

"Blu-Violet semiconductor laser diode"; O plus E, vol. 27, No. 4, p. 399-404 (2005).

* cited by examiner

*Primary Examiner* — Marc Armand
(74) *Attorney, Agent, or Firm* — Robert J. Depke; Rockey, Depke & Lyons, LLC

(57) ABSTRACT

A semiconductor light emitting device capable of precisely detecting a cleavage position is provided. A second light emitting device is layered on a first light emitting device. The second light emitting device has stripe-shaped opposed electrodes that are respectively arranged oppositely to respective p-side electrodes of the first light emitting device and electrically connected to the p-side electrodes of the first light emitting device, connection pads respectively and electrically connected to the respective opposed electrodes, a connection pad electrically connected to a p-side electrode, and marks arranged with one end in the plain face of cleavage face S3 or cleavage face S4 on an insulating layer formed on the side of a second substrate facing to a first substrate.

4 Claims, 10 Drawing Sheets

SEMICONDUCTOR LIGHT EMITTING DEVICE AND METHOD OF MANUFACTURING IT

CROSS REFERENCES TO RELATED APPLICATIONS

The present invention contains subject matter related to Japanese Patent Application JP 2006-305926 filed in the Japanese Patent Office on Nov. 10, 2006, the entire contents of which being incorporated herein by reference.

BACKGROUND OF THE INVENTION

1. Field of the Invention

The present invention relates to a semiconductor light emitting device capable of emitting one or a plurality of lights and a method of manufacturing it.

2. Description of the Related Art

In recent years, in the field of laser diodes (LD), a multi-wavelength laser device having a plurality of light emitting sections in the different light emitting wavelengths on the same substrate (or base) has been actively developed. The multi-wavelength laser device is used as, for example, a light source for an optical disk unit.

In such an optical disk unit, laser light in 700 nm band is used for reproduction of a CD (Compact Disk), and is used for recording and reproduction of a recordable optical disk such as a CD-R (CD Recordable), a CD-RW (CD Rewritable), and an MD (Mini Disk). In addition, laser light in 600 nm band is used for recording and reproduction of a DVD (Digital Versatile Disk). By mounting the multi-wavelength laser device on the optical disk unit, recording or reproduction becomes available for a plurality of types of existing optical disks. Further, a short wavelength laser device (400 nm band) using a nitride-based Group III-V compound semiconductor typified by GaN, AlGaN mixed crystal, and GaInN mixed crystal has been realized, and they work toward practical use of such a short wavelength laser device as a light source of a higher density optical disk. By developing a multi-wavelength laser device including the short wavelength laser device, applications can be more widened.

As a three-wavelength laser device having a GaN light emitting device section described above, in the past, the following device has been suggested (Japanese Patent No. 3486900). In the device, a first light emitting device in 400 nm band (for example, 405 nm) wavelength is formed by growing a GaN-based semiconductor on a substrate made of GaN (gallium nitride). A second light emitting device is formed by providing a device having a light emitting section in 600 nm band (for example, 650 nm) by growing an AlGaInP-based semiconductor and a device having a light emitting section in 700 nm band (for example, 780 nm) by growing an AlGaAs-based semiconductor on the same substrate made of GaAs (gallium arsenide) in parallel with each other. The first light emitting device and the second light emitting device are layered in this order on a support base (heat sink).

SUMMARY OF THE INVENTION

To accurately position the light emitting points of the respective light emitting sections in a given position when the first light emitting device and the second light emitting device are layered in the foregoing three-wavelength laser device, it is important to accurately detect the positions of the light emitting points of the respective light emitting sections. In general, position detection is performed by detecting coordinates in 3 directions in total composed of X-axis direction, Y-axis direction, and Z-axis direction in X-Y-Z three dimensional orthogonal coordinate system. The positions of the light emitting points of the respective light emitting sections are similarly detected.

Specifically, the position in the direction orthogonal to the resonator direction (X-axis) is detected by using a position detection mark formed on the respective surfaces of the first light emitting device and the second light emitting device. The detection precision is about within ±1 μm. The position in the lamination direction (Y-axis direction) is determined by the crystal growth thickness, the thickness of the electrode and the like, and thus the position in Y-axis direction is not necessarily detected by using the position detection mark. The precision of the position in Y-axis direction determined in the process is about within ±1 μm. The position in the resonator direction (Z-axis direction) is detected by using the position detection mark formed on the respective surfaces of the first light emitting device and the second light emitting device in the same manner as in detecting the position in X-axis direction. The detection precision depends on the precision of cleavage position. For example, the precision of cleavage position of the GaAs substrate is about ±2 μm, and the precision of cleavage position of the GaN substrate is about ±5 μm. That is, the detection precision in the resonator direction is significantly poor compared to the detection precisions in the other directions. It shows that it is not easy to accurately position the light emitting points of the respective light emitting sections in a given position.

Therefore, it is conceivable that the position in the resonator direction is detected not by using the position detection mark, but by recognizing an image of the cleavage face itself. However, in this case, when the light emitting device is made of a material transparent to light from visible light to infrared light such as a GaN-based semiconductor, the contrast in image recognition is low, and thus a sufficient precision is not able to be secured.

The foregoing shortcoming is arisen not only when the first light emitting device and the second light emitting device are layered in the foregoing three-wavelength laser device, but also when a cleavage position of various semiconductor light emitting devices is detected.

In view of the foregoing, in the invention, it is desirable to provide a semiconductor light emitting device capable of precisely detecting the cleavage position and a method of manufacturing it, and a semiconductor light emitting device formed by layering the foregoing semiconductor light emitting device on another semiconductor light emitting device and a method of manufacturing it.

According to an embodiment of the invention, there is provided a first semiconductor light emitting device including a semiconductor layer having an active layer and a first mark with an end arranged in a cleavage face.

According to an embodiment of the invention, there is provided a second semiconductor light emitting device formed by layering a first light emitting device and a second light emitting device. At least one of the first light emitting device and the second light emitting device has a semiconductor layer including an active layer and a mark with an end arranged in a cleavage face.

In the first and the second semiconductor light emitting devices according to the embodiments of the invention, the end of the mark is arranged in the cleavage face. To arrange the end of the mark in the cleavage face, the mark should be formed by cleaving the position of a member formed on or in the semiconductor layer and thereby breaking the member.

That is, the foregoing mark is formed by cleavage. The shape and the size of the mark is changed according to the cleavage position.

According to an embodiment of the invention, there is provided a third semiconductor light emitting device manufactured by the steps of: forming a semiconductor layer including an active layer on a substrate; forming a mark on the semiconductor layer; and cleaving the substrate and the semiconductor layer in a position of the mark and thereby breaking the mark.

A layer may be provided between the semiconductor layer and the mark.

In the third semiconductor light emitting device according to the embodiment of the invention, the mark broken by cleavage is provided. The shape and the size of the mark are changed according to the cleavage position when the substrate and the semiconductor layer is cleaved.

According to an embodiment of the invention, there is provided a first method of manufacturing a semiconductor light emitting device including the steps of: forming a semiconductor layer including an active layer on a substrate; forming a mark on the semiconductor layer; and cleaving the substrate and the semiconductor layer in a position of the mark and thereby breaking the mark.

In the first method of manufacturing a semiconductor light emitting device according to the embodiment of the invention, the mark is broken by cleaving the substrate and the semiconductor layer in the position of the mark. The shape and the size of the mark after being broken are changed according to the cleavage position when the substrate and the semiconductor layer are cleaved.

According to an embodiment of the invention, there is provided a second method of manufacturing a semiconductor light emitting device formed by layering a first light emitting device and a second light emitting device, the method including the steps of after forming a first semiconductor layer including a first active layer and a mark on a first substrate in this order, forming a first cleavage face by cleaving the first substrate and the first semiconductor layer in a position of the mark, and forming a break mark by breaking the mark by cleavage; after forming a second semiconductor layer including a second active layer on a second substrate, forming a second cleavage face by cleaving the second substrate and the second semiconductor layer in a given position; obtaining a position of the second cleavage face, and obtaining a position of the first cleavage face based on a shape and a size of the break mark; and layering the first light emitting device and the second light emitting device based on the respectively obtained position information of the first cleavage face and the second cleavage face.

In the second method of manufacturing a semiconductor light emitting device according to the embodiment of the invention, when the first substrate and the first semiconductor layer are cleaved in the position of the mark, the mark is broken by cleavage and thus the break mark is formed. The shape and the size of the break mark are changed according to the cleavage position when the first substrate and the first semiconductor layer are cleaved. Thus, the position of the first cleavage face of the first light emitting device can be obtained based on the shape and the size of the break mark. Meanwhile, the position of the second cleavage face of the second light emitting device can be obtained by various methods. Based on the obtained position information of the both cleavage faces, the first light emitting device and the second light emitting device are layered.

According to the first semiconductor light emitting device of the embodiment of the invention, the mark with the end arranged in the cleavage face is provided. Thus, the shape and the size of the mark are changed according to the cleavage position. Therefore, by obtaining the shape and the size of the mark, the cleavage position can be accurately obtained.

According to the second semiconductor light emitting device of the embodiment of the invention, the mark with the end arranged in the cleavage face is provided in at least one of the first light emitting device and the second light emitting device that are layered. Therefore, when the cleavage position is obtained based on the shape and the size of the mark with the use of the fact that the shape and the size of the mark are changed according to the cleavage position, and the first light emitting device and the second light emitting device are layered based on the obtained position information and the like, at least an error of the cleavage position of the light emitting device with the cleavage position obtained based on the shape and the size of the mark can be decreased. Thereby, by just that much, the first light emitting device and the second light emitting device can be accurately aligned with each other. Therefore, an accurately aligned semiconductor light emitting device can be provided.

According to the first method of manufacturing a semiconductor light emitting device of the embodiment of the invention, the mark is broken by cleaving the substrate and the semiconductor layer in the position of the mark. Thus, the shape and the size of the mark after being broken are changed according to the cleavage position when the substrate and the semiconductor layer are cleaved. Therefore, by obtaining the shape and the size of the mark, the cleavage position can be accurately obtained.

According to the second method of manufacturing a semiconductor light emitting device of the embodiment of the invention, the break mark is formed by breaking the mark by cleavage when the first substrate and the first semiconductor layer are cleaved in the position of the mark. Thus, when the cleavage position is obtained based on the shape and the size of the mark with the use of the fact that the shape and the size of the mark is changed according to the cleavage position, and the first light emitting device and the second light emitting device are layered based on the obtained position information and the like, at least an error of the cleavage position of the light emitting device with the cleavage position obtained based on the shape and the size of the mark can be decreased. Thereby, by just that much, the first light emitting device and the second light emitting device can be accurately aligned with each other. Therefore, an accurately aligned semiconductor light emitting device can be provided.

Other and further objects, features and advantages of the invention will appear more fully from the following description.

DETAILED DESCRIPTION OF THE PREFERRED EMBODIMENT

Descriptions will be given of an embodiment of the invention in detail with reference to the drawings.

Figure 1:
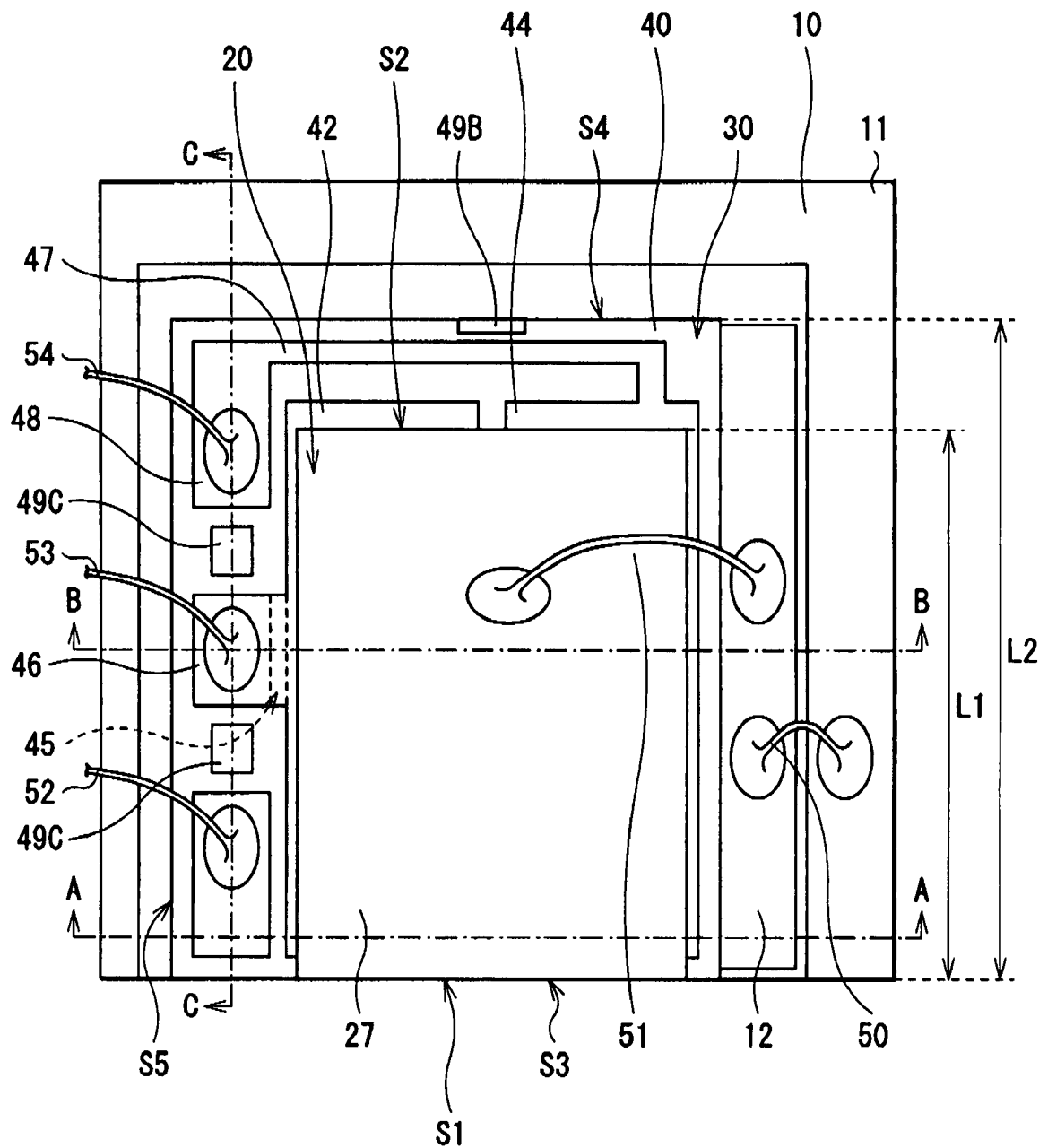
FIG. 1 is a top structure view of a semiconductor light emitting unit according to a first embodiment of the invention.
Figure 2:
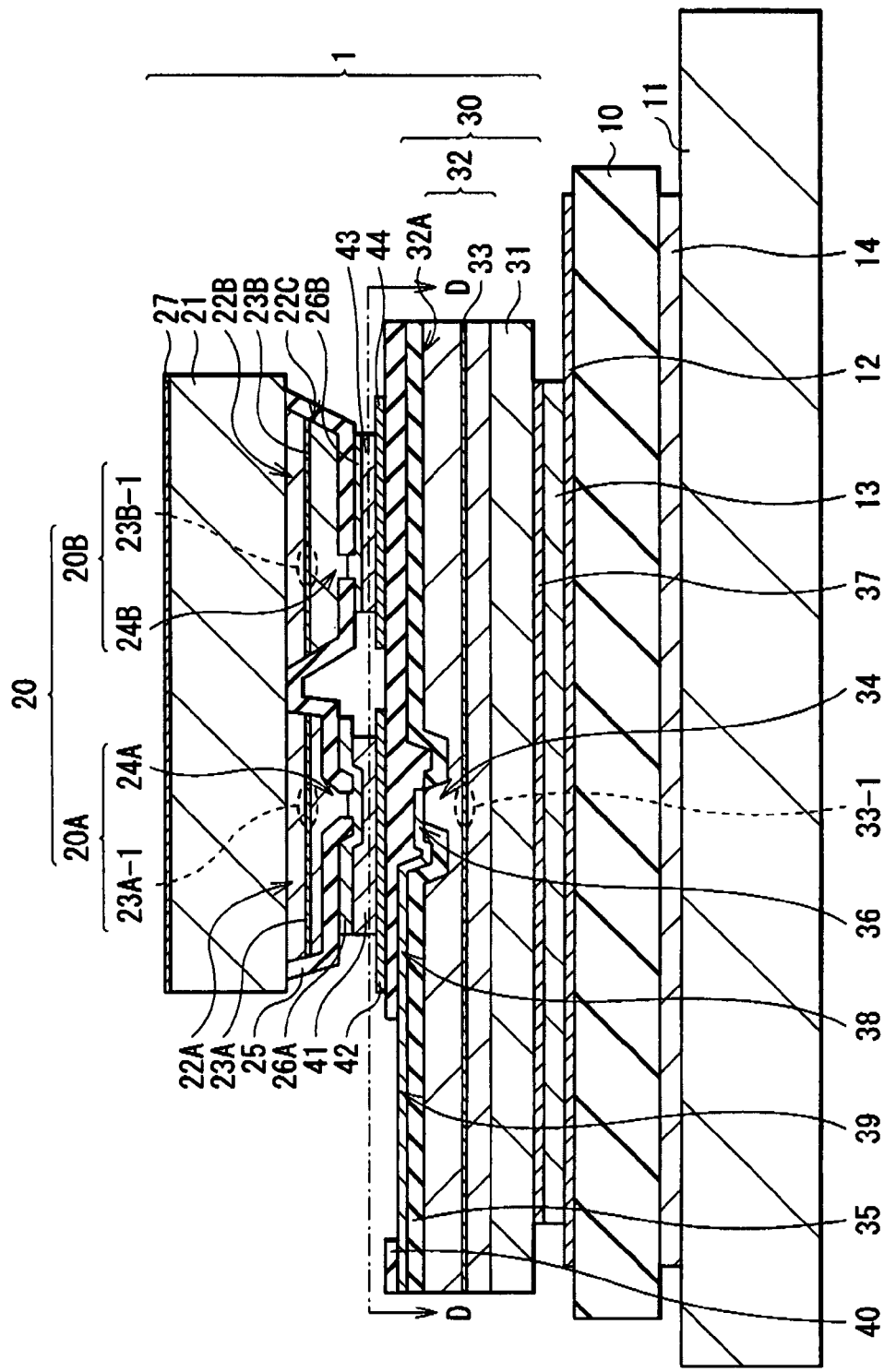
FIG. 2 is a cross sectional structure view taken along arrows A-A of the semiconductor light emitting unit of FIG. 1.
Figure 3:
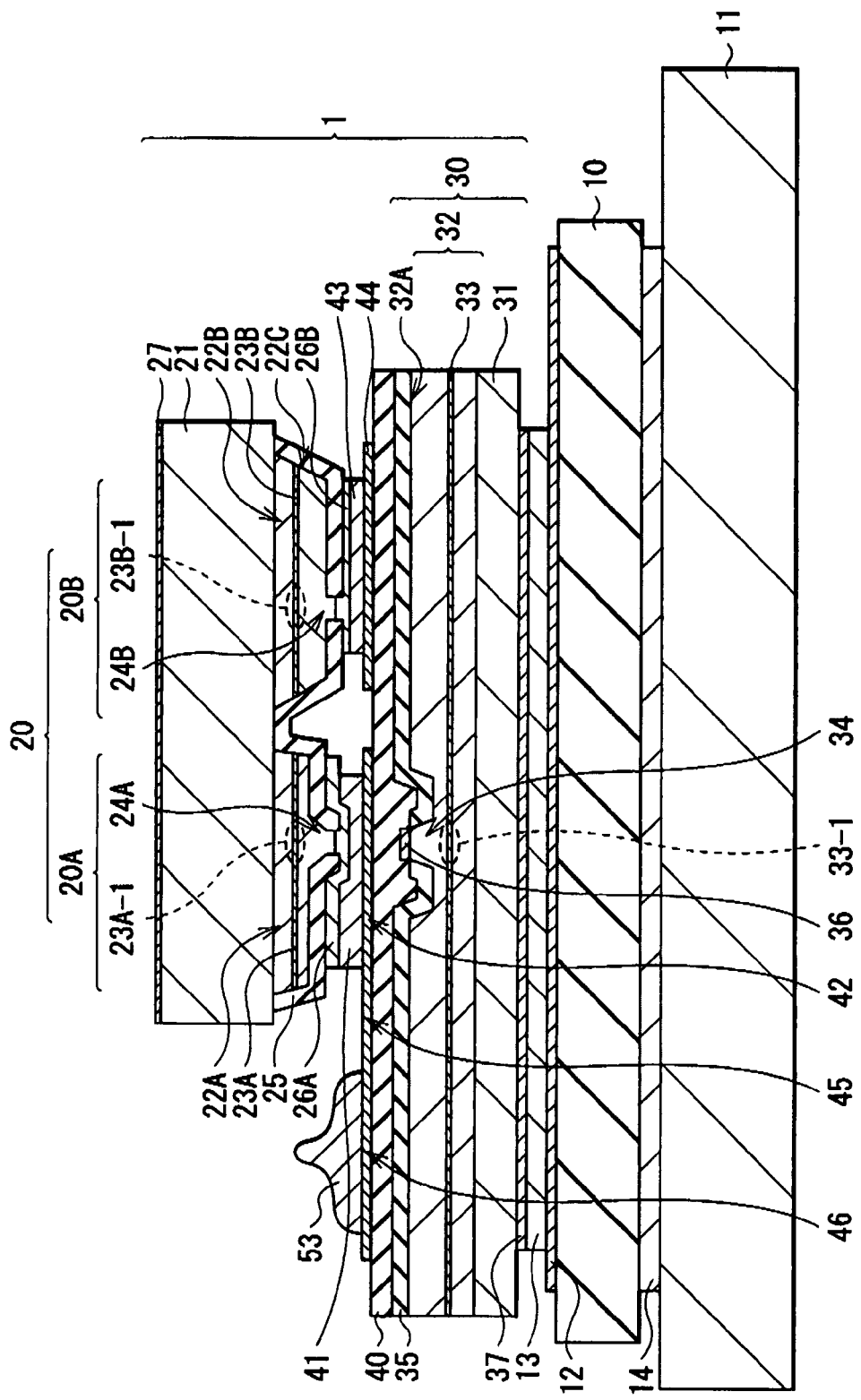
FIG. 3 is a cross sectional structure view taken along arrows B-B of the semiconductor light emitting unit of FIG. 1.
Figure 4:
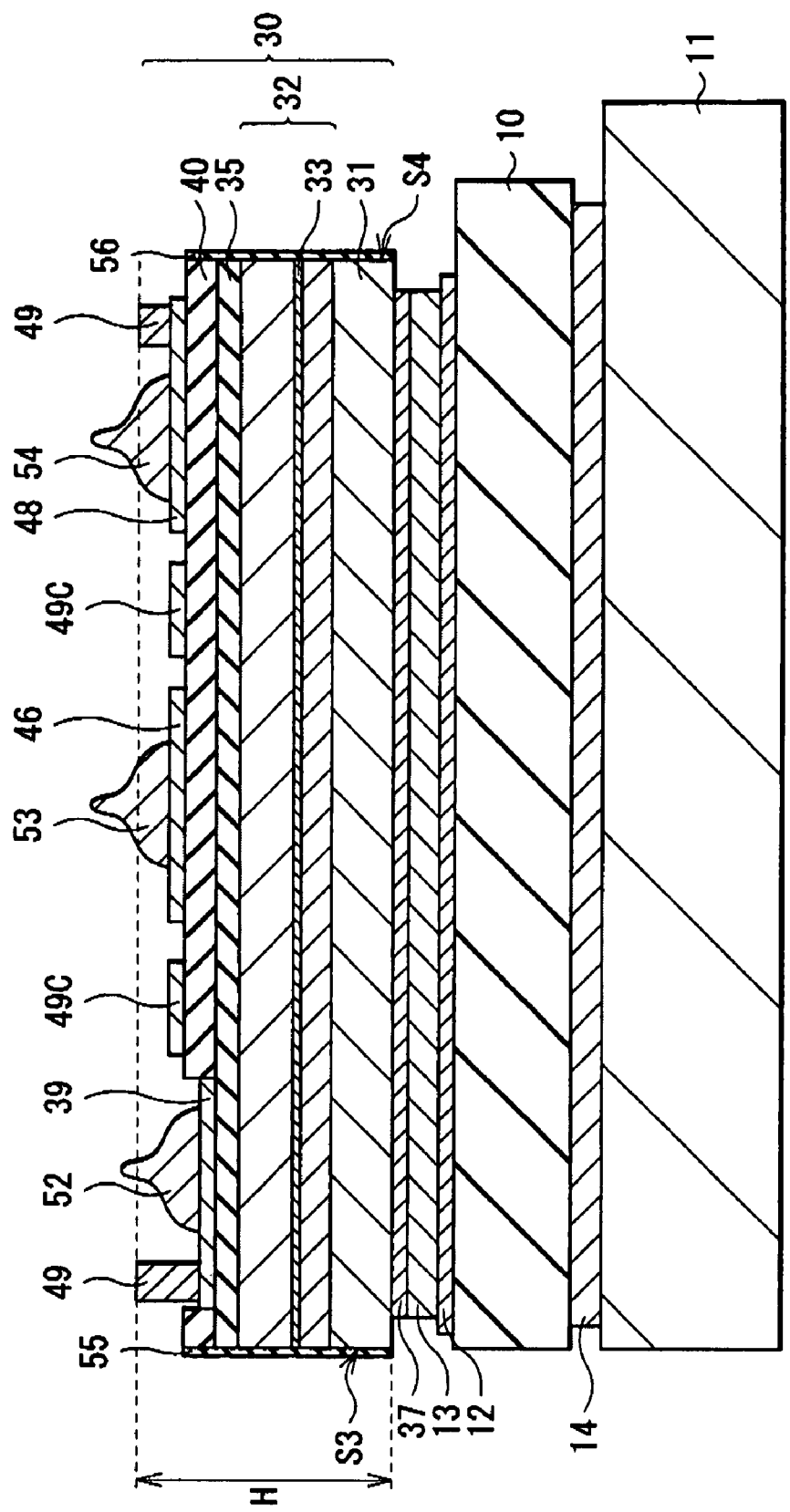
FIG. 4 is a cross sectional structure view taken along arrows C-C of the semiconductor light emitting unit of FIG. 1.
Figure 5:
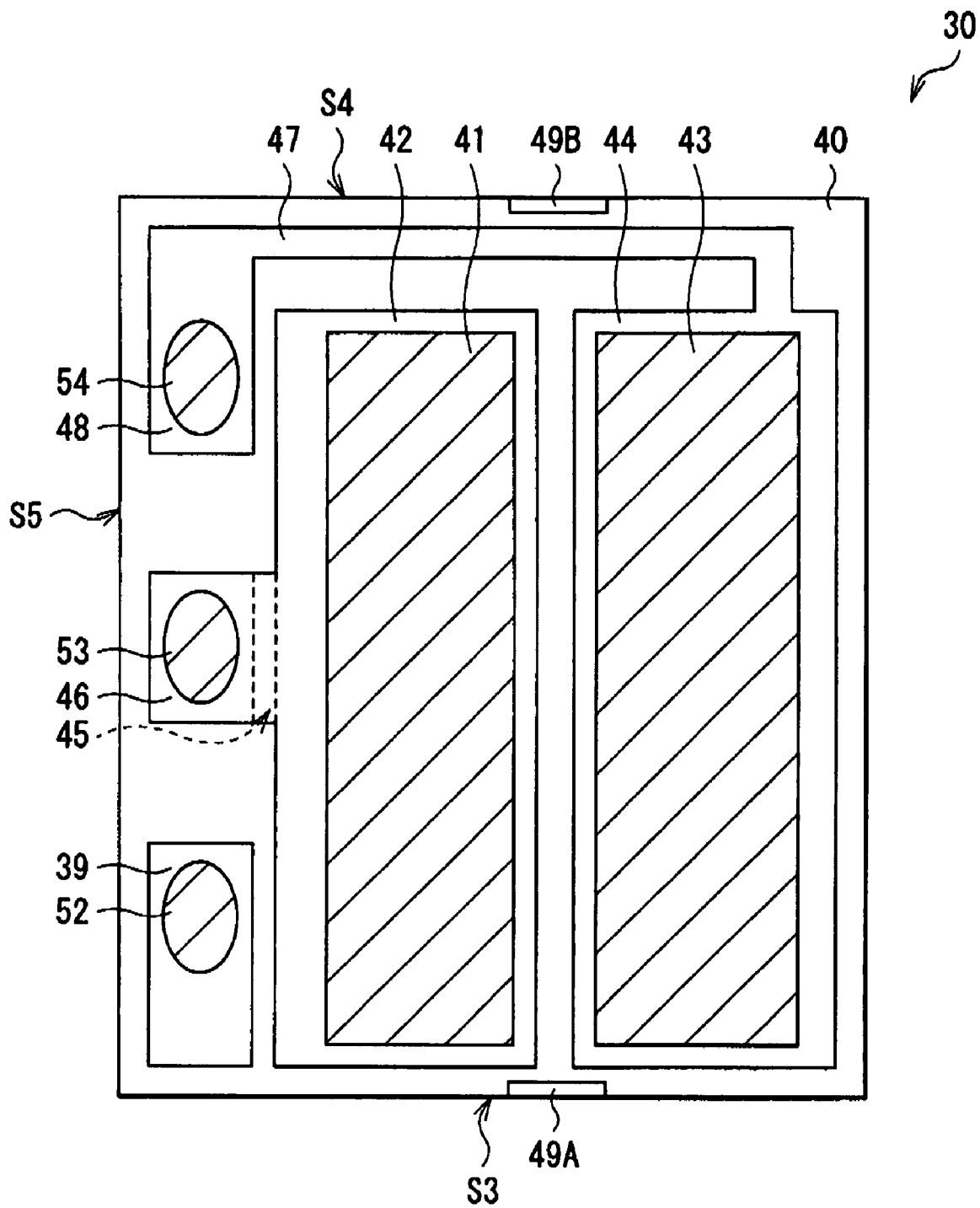
FIG. 5 is a cross sectional structure view taken along arrows D-D of the semiconductor light emitting unit of FIG. 2.

FIG. 1 shows a top view structure of a laser diode unit according to an embodiment of the invention. FIG. 2 shows a cross sectional structure taken along arrows A-A of FIG. 1. FIG. 3 shows a cross sectional structure taken along arrows B-B of FIG. 1. FIG. 4 shows a cross sectional structure taken along arrows C-C of FIG. 1. FIG. 5 shows a cross sectional structure taken along arrows D-D of FIG. 2. As shown in FIG. 2, in the laser diode unit, a laser diode 1 is joined to a submount 10 as a support member, and a heat sink 11 as a heat release member is joined to the rear face of the submount 10. FIG. 1 to FIG. 5 schematically show the laser diode unit, and the dimensions and the shapes are different from those used actually.

As shown in FIG. 2, in the laser diode 1, a chip-shaped second light emitting device 30 and a chip-shaped first light emitting device 20 are layered in this order on the submount 10. The first light emitting device 20 is composed of a first device 20A capable of emitting light for a CD in 700 nm band (for example, 780 nm) in the lamination in-plane direction, and a second device 20B capable of emitting light for a DVD in 600 nm band (for example, 650 nm) in the lamination in-plane direction. Meanwhile, the second light emitting device 30 is a device capable of emitting light in around 400 nm wavelength (for example, 405 nm) in the direction same as the light emitting direction of the first light emitting device 20. Therefore, the laser diode 1 has a function as a three-wavelength laser device.

Further, in the laser diode 1, the first light emitting device 20 is inverted (with the substrate side upward) and then is layered on the second light emitting device 30, so that a light emitting point 23A-1 (described later) of the first device 20A is close to a light emitting point 33-1 (described later) of the second light emitting device 30 as much as possible. Thereby, light emitted from the first light emitting device 20 and light emitted from the second light emitting device 30 can pass through the same light path to use a common lens system (not shown). The method of layering the first light emitting device 20 and the second light emitting device 30 is not limited thereto. For example, the first light emitting device 20 may be layered on the second light emitting device 30 so that a light emitting point 23B-1 (described later) of the first light emitting device 20 and the light emitting point 33-1 of the second light emitting device 30 are approximated to each other. Otherwise, the first light emitting device 20 may be layered on the second light emitting device 30 so that the midpoint between the light emitting point 23A-1 and the light emitting point 23B-1 of the first light emitting device 20 is approximated to the light emitting point 33-1 of the second light emitting device 30.

The submount 10 is made of a material with the significantly high thermal conductivity such as AlN. Thereby, heat generated in the laser diode 1 is sufficiently diffused, the laser diode 1 is not exposed in high temperatures, and thereby the reliability can be improved. As a material of the submount 10, Si or the like can be selected. However, in terms of the thermal conductivity, AlN is more advantageous. On the surface on the laser diode 1 side of the submount 10, an n-side common electrode 12 is formed. The n-side common electrode 12 is made of, for example, a metal thin film such as Au (gold). As shown in FIG. 1, the n-side common electrode 12 is connected to an n-side electrode 27 (described later) of the first light emitting device 20 and an n-side electrode 37 (described later) of the second light emitting device 30, respectively.

The heat sink 11 is made of, for example, a material having electrical and thermal conductivity characteristics such as Cu (copper). The surface is coated with a thin film (not shown) made of Au or the like. As shown in FIG. 1, one end of a wire 50 is bonded to the surface of the heat sink 11. The other end of the wire 50 is bonded to the surface of the n-side common electrode 12. The heat sink 11 and the n-side common electrode 12 are electrically connected to each other through the wire 50. Thereby, heat of the laser diode 1 diffused through the submount 10 is released outside to maintain the laser diode 1 at an appropriate temperature. In addition, current supplied from an external power source (not shown) can be effectively conducted to the laser diode 1 through the heat sink 11.

Between the laser diode 1 and the submount 10, a welding layer 13 for joining the laser diode 1 to the submount 10 is provided. Between the submount 10 and the heat sink 11, a welding layer 14 for joining the submount 10 to the heat sink 11 is provided (refer to FIG. 2). The welding layer 13 is made of, for example, Au—Sn (gold tin) solder with the welding temperature of 250 deg C. The welding layer 14 is made of, for example, a low-melting solder with the welding temperature about from 150 deg C. to 170 deg C. containing In (indium) or the like as a main component.

First Light Emitting Device 20

In the first light emitting device 20, as shown in FIG. 2, the first device 20A capable of emitting light in 700 nm band (for example, 780 nm) and the second device 20B capable of emitting light in 600 nm band (for example, 650 nm) are formed in parallel with each other on a common first substrate 21. The first device 20A is made of a GaP-based Group III-V compound semiconductor. The second device 20B is made of a GaAs-based Group III-V compound semiconductor. The GaP-based Group III-V compound semiconductor herein means a semiconductor containing at least Ga (gallium) of Group 3B elements in the short period periodic table and at least P (phosphorus) of Group 5B elements in the short period periodic table. The GaAs-based Group III-V compound semiconductor means a semiconductor containing at least Ga of Group 3B elements in the short period periodic table and at least As (arsenic) of Group 5B elements in the short period periodic table. Both the GaP-based Group III-V compound semiconductor and the GaAs-based Group III-V compound semiconductor are materials opaque to light from visible light to infrared light.

In the first device 20A, a semiconductor layer 22A is grown on the first substrate 21. The semiconductor layer 22A is a laser device section in which an n-type cladding layer, an active layer 23A, a p-type cladding layer, and a p-side contact layer are layered in this order from the first substrate 21 side in the lamination direction. These layers other than the active layer 23A are not particularly shown in the figures.

The first substrate 21 is made of, for example, n-type GaP that is obtained by cutting out part of a large GaP substrate. The n-type cladding layer is made of n-type AlGaInP, for example. The active layer 23A has a multi-quantum well structure composed of a well layer and a barrier layer that are respectively formed from $Al_{x1}Ga_{x2}In_{1-x1-x2}P$ ($0<x1<1$, $0<x2<1$, and $0<1-x1-x2<1$) with the composition different from each other, for example. The p-type cladding layer is made of p-type AlGaInP, for example. The p-side contact layer is made of p-type GaP, for example. Part of the p-type cladding layer and the p-side contact layer have a stripe-shaped ridge 24A extending in the uniaxial direction (direction perpendicular to the sheet of FIG. 2). Thereby, current confinement can be made. The extending direction of the ridge 24A corresponds to the resonator direction of the first device 20A. In the active layer 23A, the region corresponding to the ridge 24A is the light emitting point 23A-1.

In the second device 20B, a semiconductor layer 22B is grown on the first substrate 21 in the same manner as the first device 20A. The semiconductor layer 22B is a laser device section in which an n-type cladding layer, an active layer 23B, a p-type cladding layer, and a p-side contact layer are layered in this order from the first substrate 21 side in the lamination direction. These layers other than the active layer 23B are not particularly shown in the figures.

The n-type cladding layer is made of n-type AlGaAs, for example. The active layer 23B has a multi-quantum well structure composed of a well layer and a barrier layer that are respectively formed from $Al_{x3}Ga_{1-x3}As$ ($0<x3<1$) with the composition different from each other, for example. The p-type cladding layer is made of p-type AlGaAs, for example. The p-side contact layer is made of p-type GaAs, for example. Part of the p-type cladding layer and the p-side contact layer have a stripe-shaped ridge 24B extending in a direction in parallel with the resonator direction of the first device 20A. Thereby, current confinement can be made. The extending direction of the ridge 24B corresponds to the resonator direction of the second device 20B. Out of the active layer 23B, the region corresponding to the ridge 24B is the light emitting point 23B-1.

An insulating layer 25 is formed on the surface (hereinafter referred to as surface 22C) of the semiconductor layers 22A and 22B other than the top face of the ridges 24A and 24B (surface of the p-side contact layer). Between the surface 22C and the insulating layer 25, for example, a layer for improving contact characteristics between the surface 22C and the insulating layer 25 or the like can be arranged. The insulating layer 25 has both the high thermal conductivity and the high insulation property. In the insulating layer 25, for example, a layer including an insulating material that contains a main material such as AlN (aluminum nitride), BN (boron nitride), SiC (silicon carbide), GaN, and AlGaInN (aluminum gallium indium nitrogen) and does not contain oxygen; and a layer including an insulating material such as AlNOx, BNOx, $SiO_2$, GaNOx, and AlGaInNOx are layered in this order from the surface 22C side are layered in this order from the surface 22C side.

Since the insulating layer 25 is provided on the surface 22C, current flows only from the region provided with no insulating layer 25, that is, from the top face of the ridges 24A and 24B into the active layers 23A and 23B. Therefore, the insulating layer 25 also has a current confinement function.

A p-side electrode 26A is provided on the surface that continues from the top face of the ridge 24A to part of the surface of the insulating layer 25. The p-side electrode 26A is electrically connected to the p-side contact layer of the ridge 24A. As will be described later, the p-side electrode 26A is arranged oppositely to an opposed electrode 42 with a welding layer 41 of the second light emitting device 30 in between, and is electrically connected to the opposed electrode 42 with the welding layer 41 in between. A p-side electrode 26B is provided on the surface that continues from the top face of the ridge 24B to part of the surface of the insulating layer 25. The p-side electrode 26B is electrically connected to the p-side contact layer of the ridge 24B. As will be described later, the p-side electrode 26B is arranged oppositely to an opposed electrode 44 with a welding layer 43 of the second light emitting device 30 in between, and is electrically connected to the opposed electrode 44 with the welding layer 43 in between. Meanwhile, on the rear face of the first substrate 21, the n-side electrode 27 is provided. The n-side electrode 27 is electrically connected to the first substrate 21. As shown in FIG. 1, one end of a wire 51 is bonded to the surface of the n-side electrode 27. The other end of the wire 51 is bonded to the surface of the n-side common electrode 12. The n-side electrode 27 and the n-side common electrode 12 are electrically connected to each other through the wire 51.

The p-side electrodes 26A and 26B have a multilayer structure in which, for example, Ti (titanium), Pt (platinum), and Au (gold) are layered in this order. The n-side electrode 27 has a structure in which, for example, an alloy of Au and Ge (germanium), Ni (nickel), and Au are layered in this order from the first substrate 21 side.

On a pair of cleavage faces S1 and S2 perpendicular to the extending direction of the ridges 24A and 24B (resonator direction), a pair of reflector films (not shown) is formed. The reflector film formed on the cleavage face S1 (first cleavage face, refer to FIG. 1) on the main emitting side is made of, for example, $Al_2O_3$ (aluminum oxide), and is adjusted to have the low reflectance. Meanwhile, the reflector film formed on the cleavage face S2 on the other side of the main emitting side is made of, for example, a lamination in which an aluminum oxide layer and a $TiO_2$ (titanium oxide) layer are alternately layered, and is adjusted to have the high reflectance. Thereby, light respectively generated in the light emitting region of the active layer 23A (light emitting point 23A-1) and the light emitting region of the active layer 23B (light emitting point 23B-1) travels between the pair of reflector films, amplified, and emitted as a beam from the reflector film on the low reflectance side. It is possible that light leaked from the reflector film on the high reflectance side is detected by, for example, a photo detector or the like (not shown), the detected light is converted to a photo-electric current, and thereby the optical power of the light emitted from the low reflectance side is measured.

Second Light Emitting Device 30

The second light emitting device 30 is a laser diode capable of emitting light in around 400 nm (for example, 405 nm), and is made of a nitride-based Group III-V compound semiconductor. The nitride-based Group III-V compound semiconductor herein means a semiconductor containing at least one of Group 3B elements in the short period periodic table, and at least N (nitrogen) of Group 5B elements in the short period periodic table, and is a material transparent to light from visible light to infrared light.

As shown in FIG. 1 and FIG. 2, in the second light emitting device 30, a semiconductor layer 32 (third light emitting section) is grown on a second substrate 31. The second light emitting device 30 has resonator length L2 longer than resonator length L1 of the first light emitting device 20. The semiconductor layer 32 is a laser device section in which, for example, an n-type cladding layer, an active layer 33, a p-type cladding layer, and a p-side contact layer are layered in this order in the lamination direction from the second substrate 31 side. These layers other than the active layer 33 are not particularly shown in the figures.

Figure 6:
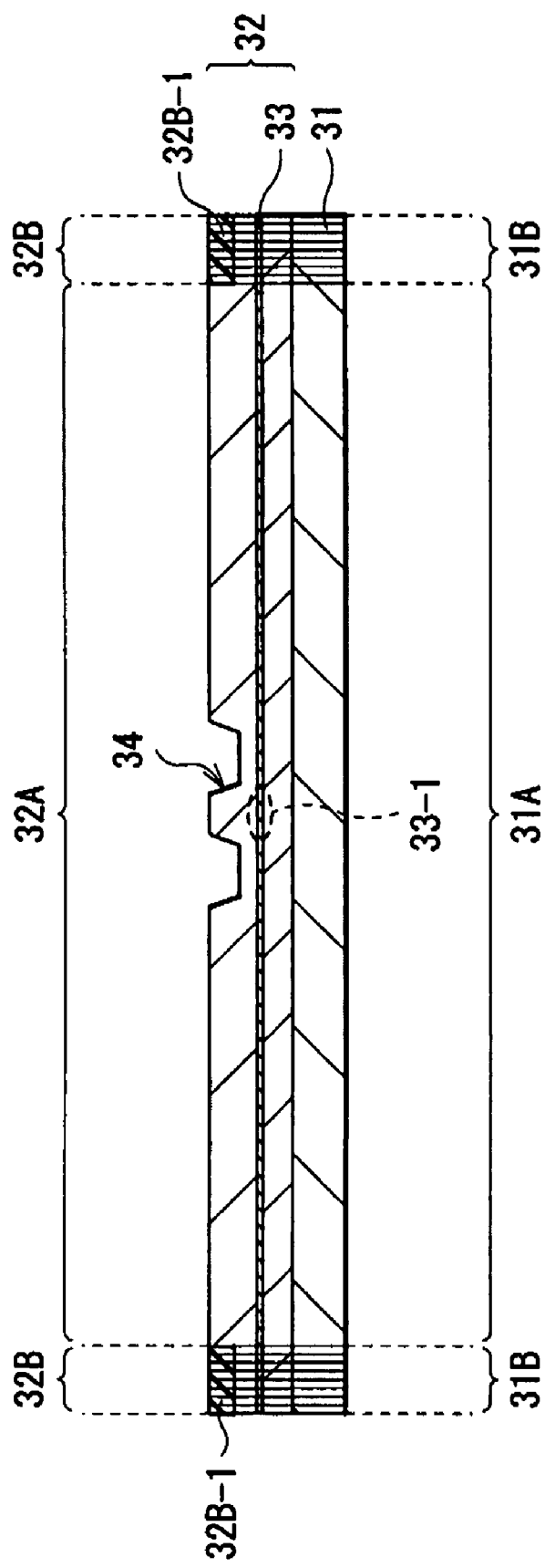
FIG. 6 is a cross sectional structure view for explaining a defect region in a second substrate.

As shown in the exploded view of FIG. 6, the second substrate 31 is made of n-type GaN (gallium nitride) having a plurality of high-defect regions 31B with the average dislocation density higher than that of a low defect region 31A adjacent to the low defect region 31A with the low average dislocation density. In this embodiment, in the second substrate 31, the low defect region 31A exists in the central region in the lateral direction (direction orthogonal to the resonator direction), and the high-defect region 31B exists in the region (region including the side face) on the both sides of the low defect region 31A.

Figure 7:
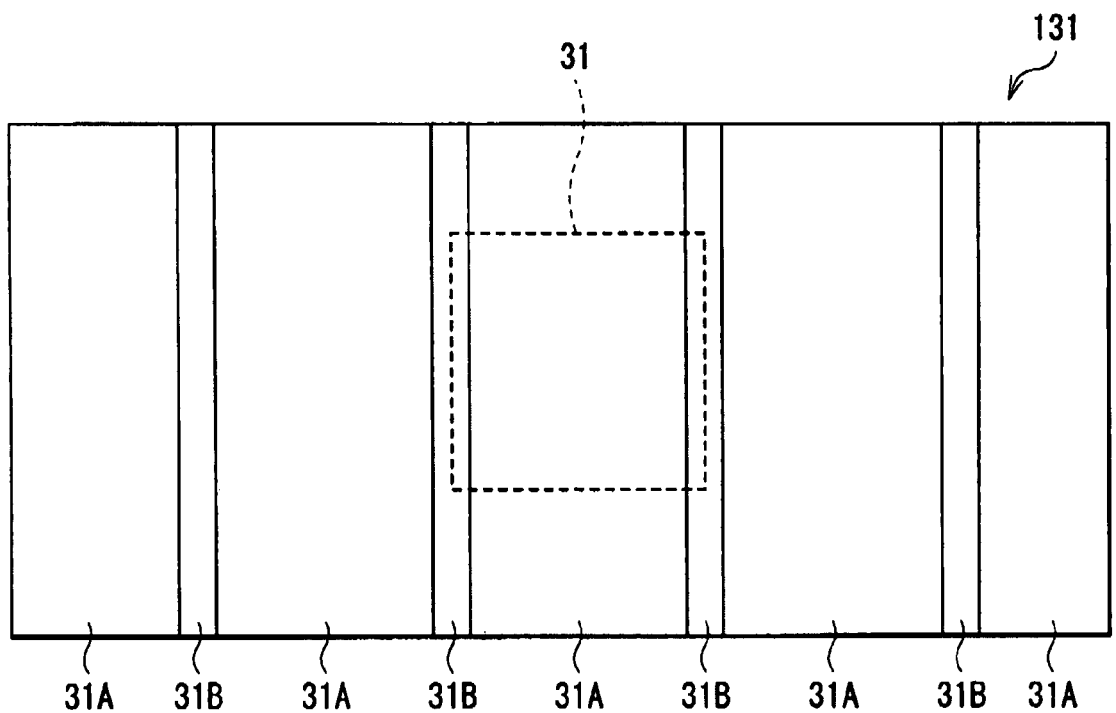
FIG. 7 is a plan structure view for explaining an example of a large GaN substrate before cutting out the second substrate of FIG. 6.
Figure 8:
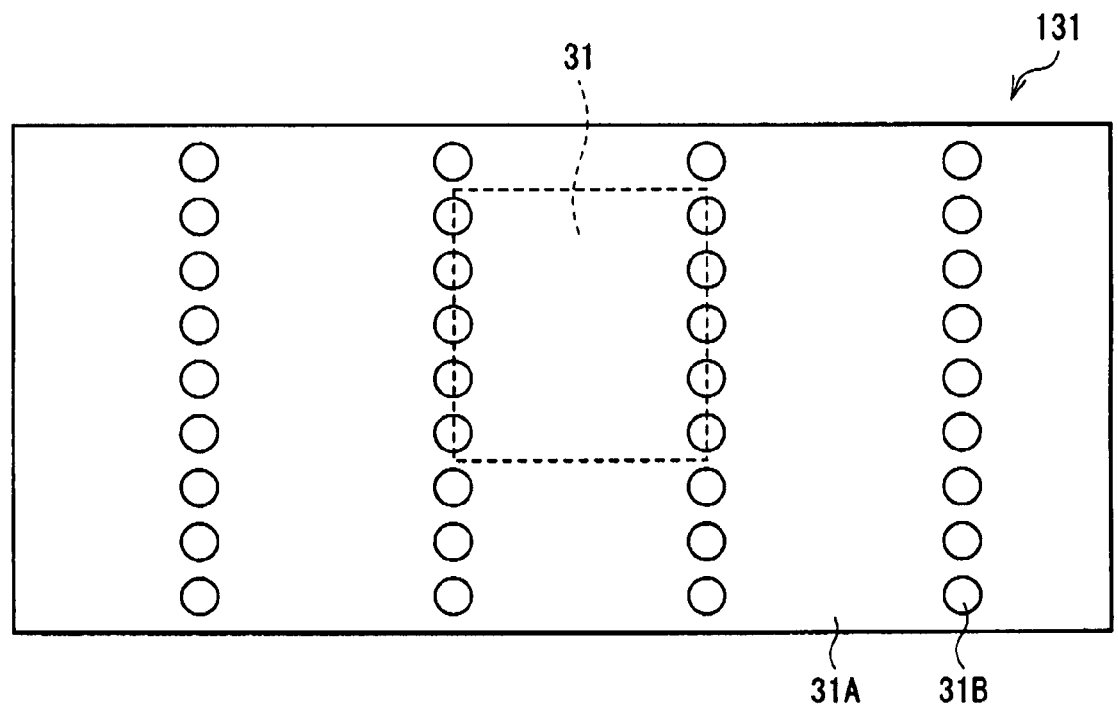
FIG. 8 is a plan structure view for explaining another example of the large GaN substrate of FIG. 7.

For example, as shown in FIG. 7 and FIG. 8, the second substrate 31 is obtained by cutting out part of a large GaN substrate 131 in which the high-defect regions 31B are regularly (cyclically) arranged in the low defect region 31A, for example, at cycles of about several hundred μm in the lateral direction. When the high-defect region 31B is in a state of a continuous strip extending in the resonator direction on the surface of the GaN substrate 131 as shown in FIG. 6, the high-defect region 31B is in the shape of a plain face penetrating the GaN substrate 131 in the resonator direction and the vertical direction. Meanwhile, when the high-defect regions 31B is in a state of a discontinuous strip extending in the resonator direction on the surface of the GaN substrate 131 as shown in FIG. 7, the high-defect region 31B distributes on the GaN substrate 131 in a state of stripe in the resonator direction, and is in the shape of a stripe penetrating the GaN substrate 131 in the vertical direction. The average dislocation density in the low defect region 31A of the GaN substrate 131 is, for example, $5 \times 10^5$ cm$^{-3}$. The average dislocation density in the high-defect region 31B is, for example, $2 \times 10^8$ cm$^{-3}$.

As described in Japanese Unexamined Patent Application Publication No. 2003-124572,the foregoing GaN substrate 131 is formed by crystal growth in a state of keeping a slant composed of a facet. By using such crystal growth method, the region with the high dislocation density can be concentrated in a given region. Further, as described above, the region with the high dislocation density and the region with the low dislocation density can be regularly and cyclically formed. In the result, as will be described later, a laser structure can be formed only in the region with the low dislocation density, and thus a device with the superior light emitting characteristics can be formed.

Meanwhile, as shown in the enlarged view of FIG. 6, the semiconductor layer 32 respectively has a high-defect region 32B in the portion corresponding to the high-defect region 31B of the second substrate 31 and a low defect region 32A in the portion corresponding to the low defect region 31A. Specifically, in the semiconductor layer 32, the low defect region 32A exists in the central region in the lateral direction, and the high-defect region 32B exists in the region (region including the side face) on the both sides of the low defect region 32A. As will be described later, the semiconductor layer 32 is formed on the second substrate 31 by epitaxial growth with the use of, for example, MOCVD (Metal Organic Chemical Vapor Deposition) method. Thus, the crystal dislocation of the second substrate 31 is propagated to the semiconductor layer 32.

Figure 9:
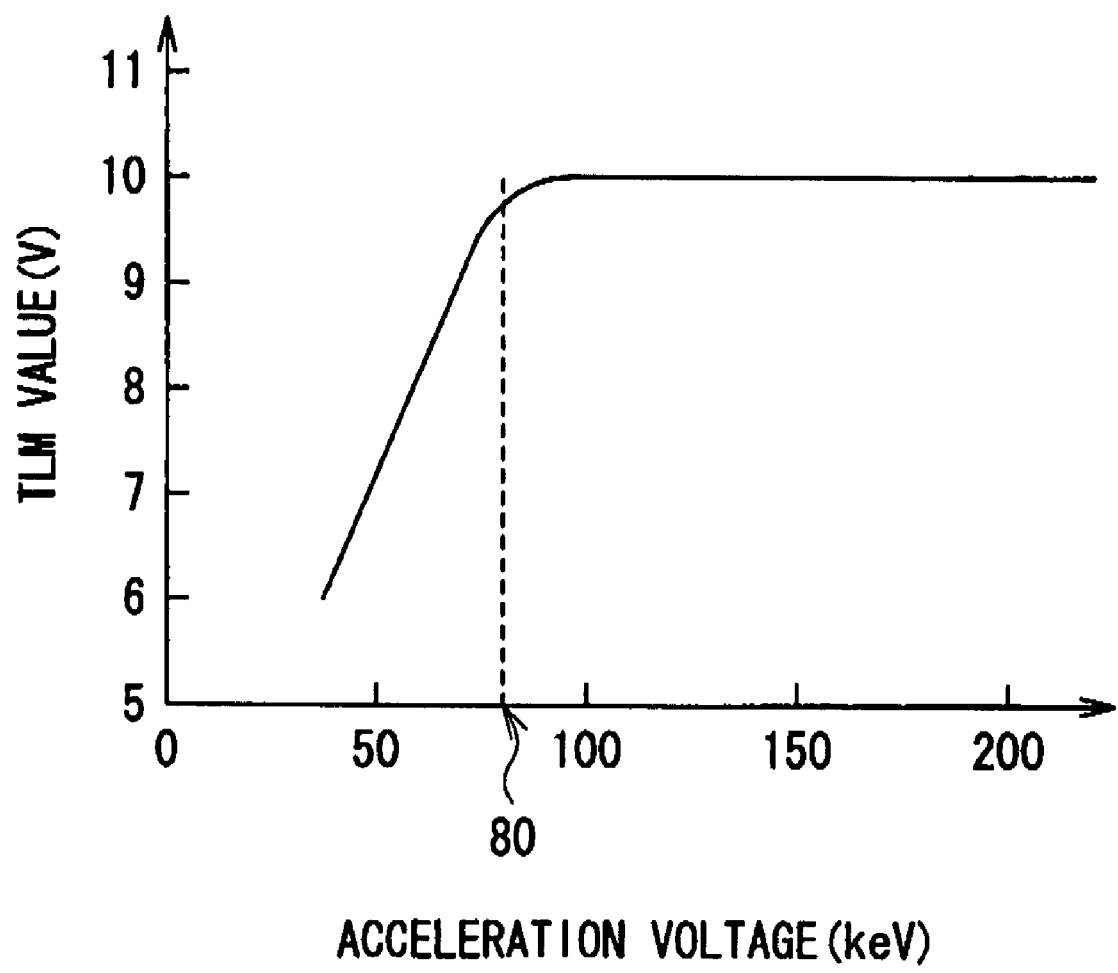
FIG. 9 is a relation diagram for explaining a relation between an acceleration voltage and a TLM value in ion implantation.

The high-defect region 32B has a high-resistance region 32B-1 on the surface of the semiconductor layer 32 and in the vicinity thereof. The high-resistance region 32B-1 is formed by, for example, ion implantation of B, N, Fe or the like onto the surface of the semiconductor layer 32 at the ion energy of 80 keV or more. As shown in FIG. 9, when the acceleration voltage applied between the terminals is 80 keV or more, the TML (transmission line method) value becomes constant, 10V. It shows that in this case, the surface of the high-defect region 32B or the vicinity thereof can be sufficiently insulated. Thereby, the high-resistance region 32B-1 prevents an event that part of an insulating layer 35 is accidentally torn when a bar 30A is processed into chips by dicing in the after-mentioned manufacturing step, and the resultant exposed portion of the high-resistance region 32B-1 and a p-side electrode 36 (described later) are short-circuited to generate a leak current and lower the light emitting intensity. In FIG. 6, the high-defect region 32B is provided on the both side faces in parallel with the resonator direction and the vicinity thereof in the surface of the semiconductor layer 32. However, the high-defect region 32B is preferably provided at least on the surface on connection pads 39, 46, and 48 side (in the vicinity of side face S5) in the surface of the semiconductor layer 32.

Otherwise, the second substrate 31 may be formed by cutting a large GaN substrate in which the plurality of high-defect regions 31B (second region) are irregularly formed in the low defect region 31A. GaN is a material with the superior heat conduction having the high thermal conductivity of about 2 W/(cm·K). When n-type GaN is used as the second substrate 31, by using such property, the second substrate 31 can also function as a heat sink that diffuses heat generated in the laser diode 1.

The n-type cladding layer is made of n-type AlGaN, for example. The active layer 33 has a multi-quantum well structure composed of a well layer and a barrier layer that are respectively formed from $Ga_{x4}In_{1-x4}N$ (0<x4<1) with the composition different from each other, for example. The p-type cladding layer is made of p-type AlGaN, for example. The p-side contact layer is made of p-type GaN, for example.

As shown in FIG. 2 and FIG. 6, part of the p-type cladding layer and the p-side contact layer have a strip-shaped ridge 34 extending in the direction in parallel with the resonator direction of the first light emitting device 20. Thereby, current confinement is made. The extending direction of the ridge 34 corresponds to the resonator direction of the second light emitting device 30. The ridge 34 is formed in the low defect region 32A of the semiconductor layer 32. In the active layer 33, a current injection region (light emitting point 33-1) is formed in the region corresponding to the ridge 34.

As shown in FIG. 2, the insulating layer 35 is formed on the continuous surface (hereinafter referred to as surface 32A) from the side face of the ridge 34 to the surface of the p-type cladding layer. Between the surface 32A and the insulating layer 35, for example, a layer for improving contact characteristics between the surface 32A and the insulating layer 35 or the like may be arranged. The insulating layer 35 has both the high thermal conductivity and the high insulation property as the foregoing insulating layer 25 does. In the insulating layer 35, for example, a layer including an insulating material that has a main material such as AlN, BN, SiC, GaN, and AlGaInN and does not contain oxygen; and a layer including an insulating material such as AlNOx, BNOx, SiO$_2$, GaNOx, and AlGaInNOx are layered in this order from the surface 32A side.

Since the insulating layer 35 is provided on the surface 32A, current flows only from the region provided with no insulating layer 35, that is, from the top face of the ridge 34 into the active layer 33. Therefore, the insulating layer 35 also has a current confinement function.

On the rear face of the second substrate 31, the n-side electrode 37 is provided. The n-side electrode 37 is electrically connected to the second substrate 31. As described above, the n-side electrode 37 is connected to the external power source with the n-side common electrode 12, the heat sink 11 and the like in between. The n-side electrode 37 has, for example, a structure in which an alloy of Au and Ge; Ni; and Au are sequentially layered from the first substrate 21 side.

The p-side electrode 36 is provided on the surface that continues from the top face of the ridge 34 (surface of the p-side contact layer) to the surface of the insulating layer 35. The p-side electrode 36 is electrically connected to the p-side contact layer. As shown in FIG. 2, in addition to the p-side electrode 36, a connection portion 38, the connection pad 39 electrically connected to the p-side electrode 36 with the connection portion 38 in between, and an insulating layer 40 having an aperture in the region of the connection pad 39 are respectively provided on the insulating layer 35. As shown in FIG. 5, the connection pad 39 is provided in the portion that is in the vicinity of the cleavage face S3 (second cleavage face) on the main emitting side and in the vicinity of the side face S5 as one of a pair of side faces oppositely arranged to each other in the direction orthogonal to the resonator direction. One end of a wire 52 is joined to the surface of the connection pad 39. The other end of the wire 52 is connected to the external power source.

The p-side electrode 36, the connection portion 38, and the connection pad 39 respectively have a multilayer structure in which, for example, Ti, Pt, and Au are layered in this order. The insulating layer 40 is made of, for example, a material similar to that of the foregoing insulating layer 35.

As shown in FIG. 3 and FIG. 5, the stripe-shaped opposed electrode 42 welded with the welding layer 41, the stripe-shaped opposed electrode 44 welded with the welding layer 43, the connection pad 46 physically and electrically connected to the opposed electrode 42 with a connection portion 45 in between, and the connection pad 48 physically and electrically connected to the opposed electrode 44 with a connection portion 47 in between are respectively provided on the insulating layer 40.

As shown in FIG. 3 and FIG. 5, the opposed electrode 42 is formed extending in the resonator direction in the central region of the chip, and is arranged in the vicinity of the cleavage face S3 side. The opposed electrode 42 is arranged oppositely to the p-side electrode 26A of the first device 20A and electrically connected to the p-side electrode 26A with the welding layer 41 in between. The opposed electrode 44 is formed adjacently to the opposed electrode 42 in the outer edge region on the opposite side of the p-side electrode 36 of the chip. The opposed electrode 44 is formed extending in the resonator direction, and is arranged in the vicinity of the cleavage face S3 side. The opposed electrode 44 is arranged oppositely to the p-side electrode 26B of the second device 20B and is electrically connected to the p-side electrode 26B with the welding layer 43 in between. FIG. 1 shows the case in which the end face on the main emitting side of the first light emitting device 20 and the cleavage face S3 on the main emitting side of the second light emitting device are arranged on the same plain face. However, this embodiment is not limited thereto. For example, the end face on the main emitting side of the first light emitting device 20 and the cleavage face S3 on the main emitting side of the second light emitting device may be arranged on a plain face different from each other.

As shown in FIG. 5, the connection pad 46 is provided in the region that is the middle region between the cleavage face S3 on the main emitting side and cleavage face S4 on the opposite side of the main emitting side, and in the vicinity of the side face S5. The connection pad 48 is provided in the region that is in the vicinity of the cleavage face S4 on the opposite side of the main emitting side and in the vicinity of the side face S5. The connection pads 46 and 48 are arranged in a line together with the connection pad 39 in the extending direction (resonator direction) of the ridge 34 of the second light emitting device 30. That is, the connection pads 39, 46, and 48 are all formed on the surface of the second light emitting device 30, are arranged side by side in a stripe-shaped region in parallel with the stripe-shaped opposed electrodes 42 and 44, and are provided between the side face S5 as one of the pair of side faces oppositely arranged in the direction orthogonal to the resonator direction and the opposed electrode 42, adjacently to the opposed electrode 42.

As shown in FIG. 5, the connection portion 45 is formed between the opposed electrode 42 and the connection pad 46. Thus, the connection portion 45 is provided in the region that is the middle region between the cleavage face S3 and the cleavage face S4, and in the vicinity of the side face S5 with the connection pad 46 in between. The connection portion 47 is formed between the opposed electrode 44 and the connection pad 48. Thus, the connection portion 47 is provided in the region that is in the vicinity of the cleavage face S4, and between the cleavage face S4 and the opposed electrodes 42 and 44.

One end of a wire 53 is joined to the surface of the connection pad 46. The other end of the wire 53 is connected to the external power source. One end of a wire 54 is joined to the surface of the connection pad 48. The other end of the wire 54 is connected to the external power source.

The welding layers 41 and 43 are intended to weld the opposed electrodes 42 and 44 to the p-side electrodes 26A and 26B so that the opposed electrodes 42 and 44 are electrically conducted to the p-side electrodes 26A and 26B. For example, the welding layers 41 and 43 are made of Au—Sn (gold tin) solder with the welding temperature of 250 deg C. The opposed electrodes 42 and 44, the connection portions 45 and 47, and the connection pads 46 and 48 are made of, for example, a metal thin film such as Au (gold).

On the cleavage faces S3 and S4 perpendicular to the extending direction of the ridge 34 (resonator direction), a pair of reflector films 55 and 56 (refer to FIG. 4) is formed. The reflector film 55 formed on the cleavage face S3 on the main emitting side is made of, for example, $Al_2O_3$, and is adjusted to have the low reflectance. Meanwhile, the reflector film 56 formed on the cleavage face S4 on the opposite side of the main emitting side is made of, for example, a lamination in which an aluminum oxide layer and a $TiO_2$ layer are alternately layered, and is adjusted to have the high reflectance. Thereby, light generated in the light emitting region of the active layer 33 (light emitting point 33-1) travels between the pair of reflector films 55 and 56, amplified, and emitted as a beam from the reflector film 55 on the low reflectance side. It is possible that light leaked from the reflector film 56 on the high reflectance side is detected by, for example, a photo detector or the like (not shown), the detected light is converted to a photo-electric current, and thereby the optical power of the light emitted from the low reflectance side is measured.

As shown in FIG. 1 and FIG. 5, marks 49A and 49B (torn mark) are provided on the surface of the insulating layer 35. The marks 49A and 49B are a marker for mainly detecting the position of the cleavage faces S3 and S4 of the second light emitting device 30 in the resonator direction. The marks 49A and 49B are used when the first light emitting device 20 and the second light emitting device 30 are layered in a manufacturing step. The marks 49A and 49B can be also used as a marker for detecting the position of the second light emitting device 30 in the direction orthogonal to the resonator direction.

At least each one end of the marks 49A and 49B is arranged in the plain face of the cleavage face S3 or the cleavage face S4. In FIG. 1 and FIG. 5, the mark 49A is provided on the cleavage face S3 side, and the mark 49B is provided on the cleavage face S4 side. Otherwise, the marks 49A and 49B may extend to the counterpart cleavage face to be united. When the marks 49A and 49B are integrally formed as above, the united marks 49A and 49B can be used as the p-side electrode 36.

Figure 10:
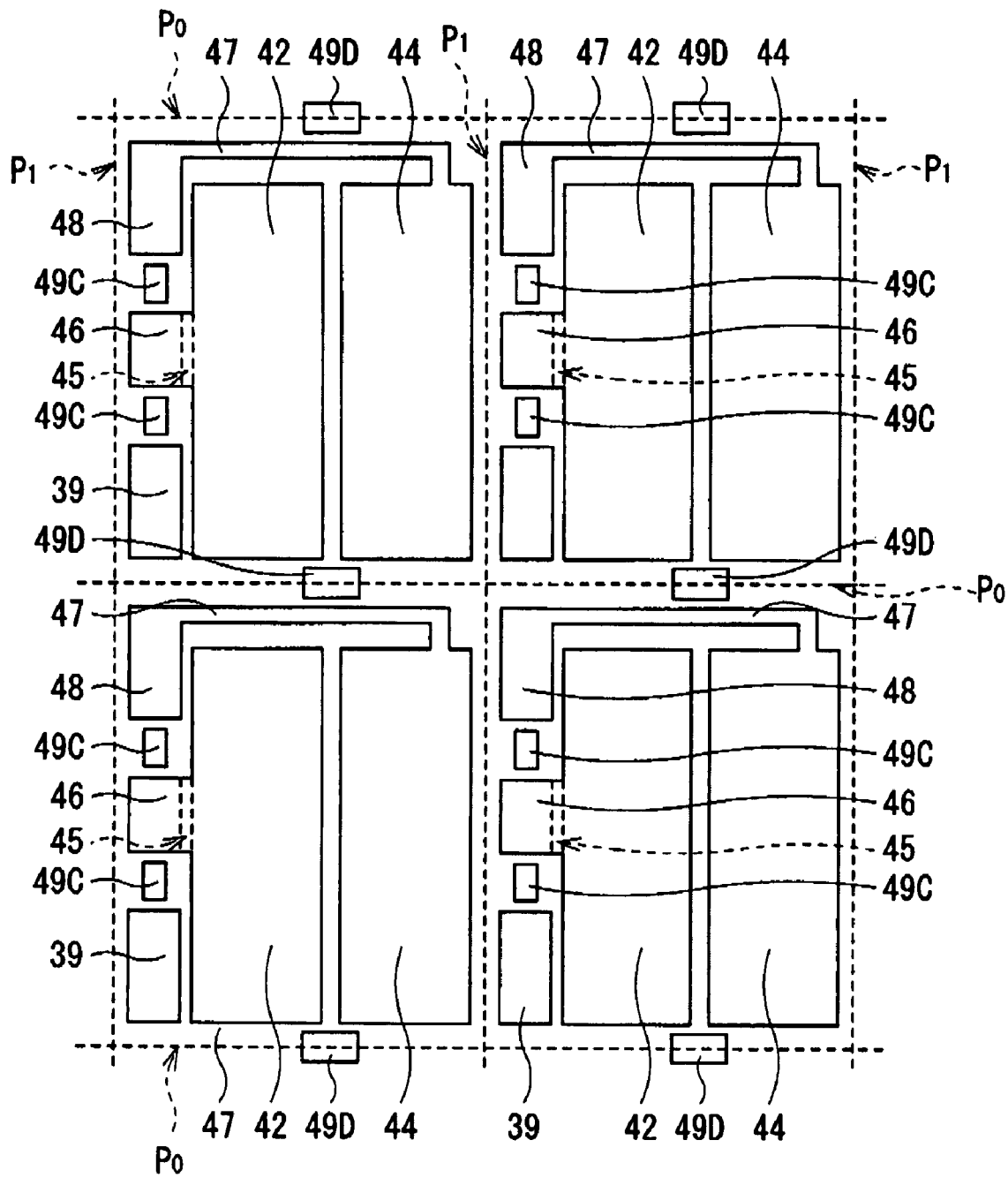
FIG. 10 is a cross section for explaining a position mark of FIG. 1.

As shown in FIG. 10, the marks 49A and 49B are formed by breaking a mark 49D by cleaving a semiconductor substrate in the position of the mark 49D (specifically, cleavage region Po where the semiconductor substrate is cleaved) that is formed on the surface of the insulating layer 35 on the large semiconductor substrate (for example, GaN substrate 131) before cutting out the second substrate 31 in a manufacturing step. That is, the marks 49A and 49B are formed by cleavage. Thus, the shape and the size of the marks 49A and 49B are changed according to the cleavage position. Therefore, by obtaining the shape and the size of the marks 49A and 49B with the use of an image recognition apparatus or the like, the position of the cleavage faces S3 and S4 in the resonator direction (cleavage position), and further, the position of the light emitting spot in the cleavage face S3 in the resonator direction can be accurately obtained. FIG. 10 is a plan structural view of a semiconductor substrate in which the mark 49D, the opposed electrode 42 and the like are formed on the insulating layer 35 in a manufacturing step. The dashed lines in FIG. 10 represent dicing region P$_1$.

The mark 49D is made of an independent island-like metal film that is not contacted with a conductive member such as the opposed electrode 42. Thus, marks 49A and 49B obtained by breaking the mark 49D are made of an independent island-like metal film that is not contacted with a conductive member such as the opposed electrode 42 as the mark 49D is. Therefore, the marks 49A and 49B do not have an electrical function such as injecting current into the ridge 34. The marks 49A, 49B, and 49D are made of a material similar to that of the opposed electrode 42 and the like. Thus, the mark 49D can be formed at a time together with the opposed electrode 42 and the like in a manufacturing step.

As described above, the shape and the size of the mark 49A are determined when the mark 49D is broken by cleavage. Therefore, the shape and the size of the mark 49A are a function changing according to the cleavage position in cleavage.

As shown in FIG. 1 and FIG. 5, for example, a mark 49C is provided between the connection pad 39 and the connection pad 46, and between the connection pad 46 and the connection pad 48 in the surface of the insulating layer 35. The mark 49C is a marker for detecting the position of the second light emitting device 30 in the direction orthogonal to the resonator direction. The mark 49C is used when the first light emitting device 20 and the second light emitting device 30 are layered in a manufacturing step. The mark 49C may be arranged to sandwich the line of the first connection pads 39, 46, and 48 in the parallel direction. In this case, the first connection pads 39, 46, and 48 can be located apart from the cleavage faces S3 and S4, and thereby leak fault can be prevented from being generated in the high-defect region 32B in the vicinity of the cleavage faces S3 and S4.

As shown in FIG. 1 and FIG. 5, in the same manner as the mark 49A, the mark 49C may be made of an independent island-like metal film that is not contacted with a conductive member such as the opposed electrode 42. Otherwise, the mark 49C may be contacted with the conductive member such as the opposed electrode 42. The mark 49C is made of a material similar to that of the opposed electrode 42 and the like. The mark 49C may be formed at a time together with the opposed electrode 42 and the like in a manufacturing step.

The semiconductor light emitting unit having the foregoing structure can be manufactured as below, for example.

First, the first light emitting device 20 as one of the components of the laser diode 1 is formed. The semiconductor layer 22A is formed by, for example, MOCVD method. At this time, as a raw material of the GaP-based Group III-V compound semiconductor, for example, TMA (trimethyl aluminum), TMG (trimethyl gallium), TMIn (trimethyl indium), or PH$_3$ (phosphine) is used.

Specifically, the n-side contact layer, the n-type cladding layer, the active layer 23A, the p-type cladding layer, and the p-side contact layer are layered in this order on a large GaP substrate to form the semiconductor layer 22A. Subsequently, in the semiconductor layer 22A, the p-side contact layer and the p-type cladding layer are provided with patterning by, for example, dry etching method so that a narrow strip-shaped convex portion is obtained to form a plurality of ridges 24A in parallel with each other at given intervals.

Next, the semiconductor layer 22B is formed by a method similar to the foregoing method. As a raw material of the GaAs-based Group III-V compound semiconductor, for example, TMA, TMG, TMIn, and AsH$_3$ (arsine) is used.

Specifically, on the portion where the ridge 24A is not formed in the surface of the GaP substrate, the n-side contact layer, the n-type cladding layer, the active layer 23B, the p-type cladding layer, and the p-side contact layer are layered in this order to form the semiconductor layer 22B. Subsequently, in the semiconductor layer 22B, the p-side contact layer and the p-type cladding layer are provided with patterning by, for example, dry etching method so that a narrow strip-shaped convex portion is obtained to form the ridge 24B between the ridges 24A.

Next, an insulating material that contains a main material such as AlN, BN, SiC, GaN, and AlGaInN and does not contain oxygen (for example, AlN) is formed on the top face of the ridges 24A and 24B and on the surface A by deposition or sputtering. After that, the resultant surface is oxidized by, for example, exposing the surface in moisture vapor or the like. Thereby, an oxide such as AlNOx is formed on the surface, and the insulating layer 25 is formed.

Next, in the insulating layer 25, the region corresponding to the top face of the ridges 24A and 24B (surface of the contact layer) is removed by etching. After that, the p-side electrode 26A is formed on the continuous surface from the surface of the p-side contact layer of the ridge 24A to part of the surface of the insulating layer 25. The p-side electrode 26B is formed on the continuous surface from the surface of the p-side contact layer of the ridge 24B to part of the surface of the insulating layer 25.

Next, the GaP substrate is cleaved to form a bar 20A on which the ridges 24A and 24B are alternately arranged in parallel with each other. After that, the pair of reflector films 55 and 56 is formed on the cleavage faces S1 and S2. Subsequently, the bar 20A is die-cut for every pair of ridges 24A and 24B to obtain a chip. Thereby, the first light emitting device 20 is formed.

Next, the second light emitting device 30 is formed. The semiconductor layer 32 is formed by, for example, MOCVD method. As a raw material of the nitrogen-based Group III-V compound semiconductor, for example, TMA (trimethyl aluminum), TMG (trimethyl gallium), TMIn (trimethyl indium), or ammonium ($NH_3$) is used.

Specifically, the n-side contact layer, the n-type cladding layer, the active layer 33, the p-type cladding layer, and the p-side contact layer are layered in this order on the GaN substrate 131 (refer to FIG. 7 and FIG. 8) to form the semiconductor layer 32. Subsequently, in the semiconductor layer 32, the p-side contact layer and the p-type cladding layer are provided with patterning by, for example, dry etching method so that a narrow strip-shaped convex portion is obtained to form each ridge 34 for every low defect region 32A, and the respective ridges 34 are formed in parallel with each other.

Next, ion implantation of B, N, Fe or the like is made onto the surface of the high-defect region 32B included in the GaN substrate 131 at the ion energy of 80 keV or more. Thereby, the high-resistance region 32B-1 is formed on the surface of the high-defect region 32B and in the vicinity thereof. After that, the insulating layer 35 is formed on the top face of the ridge 34 and the surface B with the use of a method similar to the method of forming the insulating layer 25.

Next, in the insulating layer 35, the region corresponding to the top face of the ridge 34 (surface of the contact layer) is removed by etching. After that, the p-side electrode 36, the connection portion 38, and the connection pad 39 are formed at a time on the continuous surface from the surface of the p-side contact layer of the ridge 34 to part of the surface of the insulating layer 35.

Next, the insulating layer 40 having an aperture in the region of the connection pad 39 is formed. After that, the opposed electrodes 42 and 44, the connection portions 45 and 47, the connection pads 46 and 48, and the marks 49C and 49D are formed at a time on the insulating layer 40.

Next, the GaN substrate 131 is cleaved to form the bar 30A on which the plurality of ridges 34 are arranged in parallel with each other. Thereby, the mark 49D is broken by cleavage, and thus the marks 49A and 49B are formed. After that, the pair of reflector films 55 and 56 is formed on the cleavage faces S3 and S4 formed by cleavage.

Next, the bar 30A is die-cut between each ridge 34 to obtain a chip. Thereby, the second light emitting device 30 is formed.

Next, the first light emitting device 20 with the semiconductor layers 22A and 22B side downward (with the semiconductor layers 22A and 22B side facing to the second light emitting device 30 side) is joined to the surface on the semiconductor layer 33 side of the second light emitting device 30, so that the main emitting side face out of the end faces (cleavage faces) of the first light emitting device 20 and the cleavage face S3 of the second light emitting device 30 are in the same plain face, and so that two spots from which light is emitted (regions corresponding to the light emitting points 23A-1 and 23B-1) in the first light emitting device 20 and the spot from which light is emitted (region corresponding to the light emitting point 33-1) in the second light emitting device 30 have a given physical relationship. Specifically, a given position of the first light emitting device 20 and the marks 49A, 49B, and 49C of the second light emitting device 30 are recognized by using an image recognition apparatus or the like to detect the positions thereof. Based on the detected position information (X—Y-Z three dimensional orthogonal coordinates), the first light emitting device 20 and the second light emitting device 30 are layered. Consequently, the laser diode 1 of this embodiment is formed.

Next, the second light emitting device 30 of the laser diode 1 is joined to the submount 10 with the welding layer 13 in between. After that, the rear face of the submount is fixed on the heat sink 11 by the welding layer 14 (refer to FIG. 2).

Finally, by bonding the wires 50 to 54, the semiconductor light emitting unit of this embodiment is manufactured.

In the semiconductor light emitting unit of this embodiment, when a given voltage is applied between the connection pad 39 electrically connected to the p-side electrodes 36 and the heat sink 11 electrically connected to the n-side electrode 37, current is injected into the active layer 33, and light emission is generated due to electron-hole recombination. Then, laser light in the wavelength of about 400 nm (for example, 405 nm) is emitted from the light emitting point 33-1 of the second light emitting device 30 in the lamination in-plane direction. When a given voltage is applied between the connection pad 46 electrically connected to the p-side electrode 26A and the heat sink 11 electrically connected to the n-side electrode 27, current is injected into the active layer 33A, and light emission is generated due to electron-hole recombination. Then, laser light in 600 nm band (for example, 650 nm) is emitted from the light emitting point 33A-1 of the first device 20A. When a given voltage is applied between the connection pad 48 electrically connected to the p-side electrode 26B and the heat sink 11 electrically connected to the n-side electrode 27, current is injected into the active layer 33B, and light emission is generated due to electron-hole recombination. Then, laser light in 700 nm band (for example, 780 nm) is emitted from the light emitting point 33B-1 of the second device 20B. As above, in the semiconductor light emitting unit of this embodiment, the second light emitting device 30, the first device 20A, and the second device 20B can independently emit laser light in the wavelength different from each other.

At this time, in the laser diode 1, Joule heat is generated due to the high current density. The heat generated in the second light emitting device 30 is dissipated to the heat sink 11 side. Meanwhile, the heat generated in the first light emitting device 20 is dissipated to the second light emitting device 30 side through the ridges 22A-1 and 22B-1, and the insulating layers 25 and 35.

In this embodiment, the second light emitting device 30 having the semiconductor layer 32 formed from the nitrogen-based Group III-V compound semiconductor with the high heat release characteristics is provided in contact with the first light emitting device 20. Therefore, the heat of the first light emitting device 20 can be sufficiently diffused through the second light emitting device 30 and the heat sink 11. As just described, in the laser diode 1, the heat generated in the first light emitting device 20 and the second light emitting device 30 can be effectively diffused. Therefore, the heat resistance is lowered, and the heat release characteristics can be improved. Consequently, the characteristics and the reliability of the laser diode 1 can be improved.

In this embodiment, the connection pads 39, 46, and 48 that are respectively and electrically connected to the p-side electrodes 26A, 26B, and 36 separately supplying current to the respective ridges 24A, 24B, and 34 are all formed on the surface of the second light emitting device 30 (surface on the opposite side of the heat sink 11); are arranged in parallel with the stripe-shaped opposed electrodes 42 and 44; and are provided between the side face S5 as one of the pair of side faces oppositely arranged to each other in the direction orthogonal to the resonator direction and the opposed electrode 42, adjacently to the opposed electrode 42 (refer to FIG. 1, FIG. 2, and FIG. 5). Thereby, even when the second light emitting device 30 is formed slightly large for the purpose of securing heat release characteristics of the laser diode 1 itself, an unused space of the surface of the second light emitting device 30 can be filled with the connection pads 39, 46, and 48. Therefore, an unused space created depending on the layout of the connection pads 39, 46, and 48 can be minimized. As described above, by devising the layout of the connection pads 39, 46, and 48, the laser diode 1 can be downsized while the heat release characteristics can be secured.

In this embodiment, as shown in FIG. 1 and FIG. 5, the mark 49A formed by breaking the mark 49D by cleaving the large semiconductor substrate before cutting out the second substrate 31 is provided in the very vicinity of the cleavage faces S3 and S4 in the surface of the insulating layer 35 in the second light emitting device 30. The shape and the size of the mark 49A are a function changing according to the cleavage position in cleavage as described above. Therefore, by obtaining the shape and the size of the mark 49A, the position of the cleavage faces S3 and S4 in the resonator direction (cleavage position), and further, the position in the resonator direction of the light spot from which light is emitted in the cleavage face S2 can be accurately obtained. Thereby, an error of the cleavage position of the second light emitting device 30 and an error of the position of the light spot of the second light emitting device 30 can be decreased. By just that much, the cleavage face on the main emitting side of the first light emitting device 20 can be accurately aligned with the cleavage face S3 of the second light emitting device 30, and the light spot of the first light emitting device 20 can be accurately aligned with the light spot of the second light emitting device 30.

APPLICATION EXAMPLE

The semiconductor light emitting unit LD according to the first embodiment can be applied to various devices such as an information reproduction unit for reproducing information recorded in a recording medium (optical disk), an information recording unit for recording information onto a recording medium, an information recording/reproduction unit having the foregoing both functions, and a communication device. A description will be hereinafter given of an example thereof.

Figure 11:
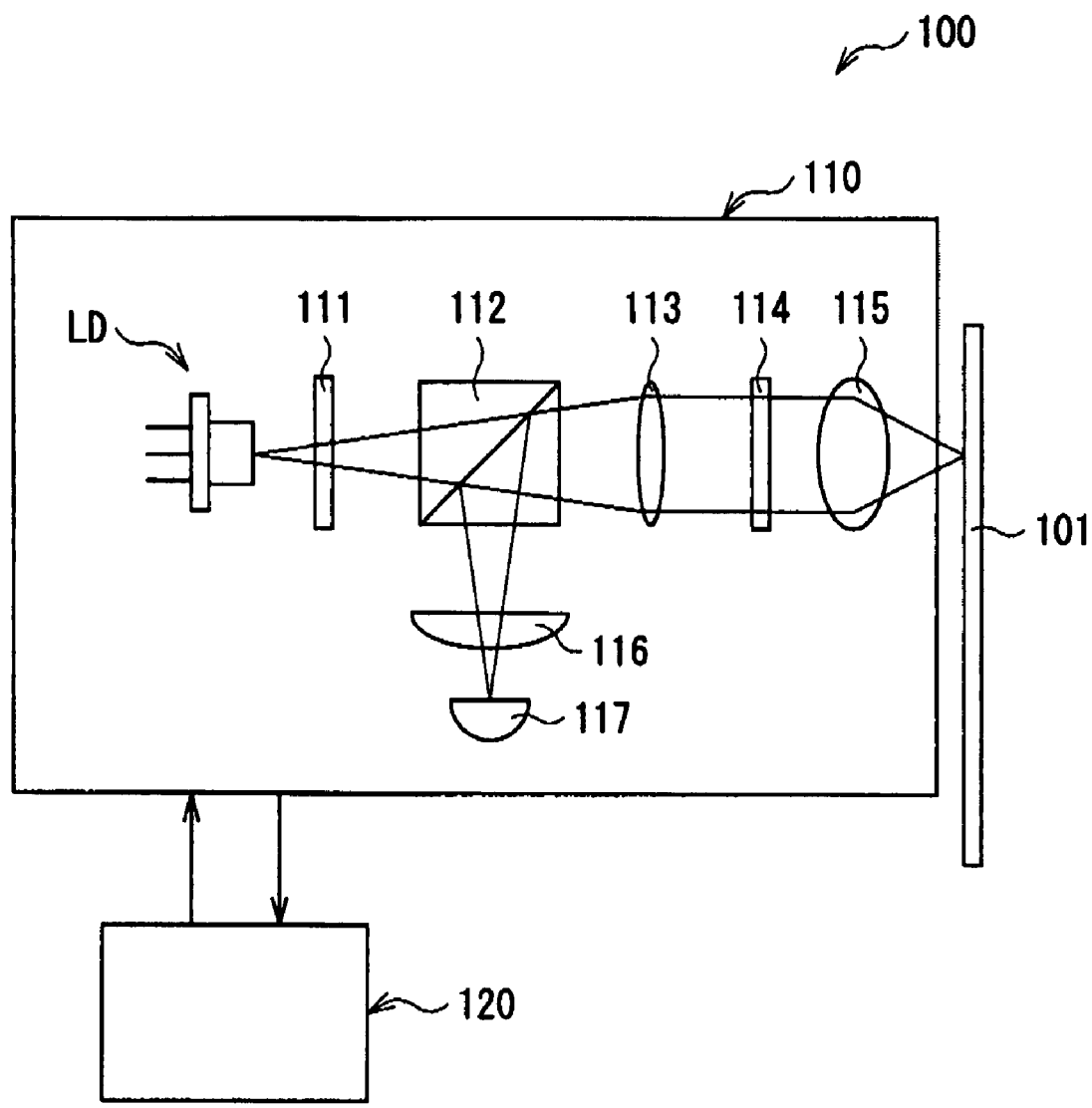
FIG. 11 is a schematic structural view of an information recording/reproduction unit mounting the semiconductor light emitting unit.

FIG. 11 shows an example of a schematic structure of an information recording/reproduction unit 100 according to this application example. The information recording/reproduction unit 100 includes an optical unit 110 and an information processing section 120.

The information processing section 120 acquires information recorded in a recording medium 101 from the optical unit 110, and sends inputted information to the optical unit 110. Meanwhile, the optical unit 110 is used as an optical pickup unit for high density recording and reproduction by, for example, a DVD or the like. The optical unit 110 includes a semiconductor light emitting unit LD as a light source and an optical system provided between a region mounted with the recording medium 101 such as a DVD and the semiconductor light emitting unit LD. On the surface of the recording medium 101, for example, lots of pits (projections) sized several μm are formed. The optical system is arranged in the light path from the semiconductor light emitting unit LD to the recording medium 101. For example, the optical system has a grating (GRT) 111, a polarizing beam splitter (PBS) 112, a collimation lens (CL) 113, a quarter-wave plate (λ/4 plate) 114, and an object lens (OL) 115. In addition, the optical system has a cylindrical lens (CyL) 116 and a light receiving device (PD) 117 such as a photodiode on the light path separated by the polarizing beam splitter (PBS) 112.

In the optical unit 110, light from the light source (semiconductor light emitting unit LD) passes through the GRT 111, the PBS 112, the CL 113, the λ/4 plate 114, and the OL 115, focuses on the recording medium 101, and is reflected by the pits on the surface of the recording medium 101. The reflected light passes through the OL 115, the λ/4 plate 114, the CL 113, the PBS 112, and the CyL 116 to enter the PD 117. Then, a pit signal, a tracking signal, and a focus signal are read.

As above, in the optical unit 110 in this embodiment, the semiconductor light emitting unit LD is used as a light source. Therefore, the temperature characteristics and the reliability are high, and stable usage is enabled in a wide temperature range. Further, the degree of freedom of designing the optical system can be widened.

While descriptions have been hereinbefore given of the invention with reference to the embodiment, the invention is not limited to the foregoing embodiment, and various modifications may be made.

For example, in the foregoing embodiment, descriptions have been given with reference to the gallium arsenic (GaAs)-based Group III-V compound laser diode or the indium phosphorous (InP)-based Group III-V compound laser diode as the first light emitting device 20 and the nitrogen-based Group III-V compound laser diode as the second light emitting device 30; and with the examples for the compositions and the structures thereof. However, the invention can be similarly applied to a laser diode having other composition or other structure.

Further, though in the foregoing embodiment, the mark 49A is provided on the second light emitting device 30. A similar mark may be provided on the first light emitting device 20, and the mark may be used for detecting the cleavage position on the main emitting side of the first light emitting device 20 and the position of the light spot of the first light emitting device 20. Thereby, an error of the cleavage position of the first light emitting device 20 and an error of the light spot position of the first light emitting device 20 can be decreased. By just that much, the cleavage face on the main emitting side of the first light emitting device 20 can be accurately aligned with the cleavage face S3 of the second light emitting device 30, and the light spot of the first light emitting device 20 can be accurately aligned with the light spot of the second light emitting device 30.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor light emitting device comprising:
a semiconductor layer including an active layer; and
a first mark arranged in a cleavage face located on a laser light emitting structure including the semiconductor layer, and further wherein there are a plurality of marks at different structure portions of the device that are used in positioning light emitting elements, wherein the first mark identifies a light emission direction and the plurality of marks are at a side of the structure aligned in the light emission direction, and further wherein at least one of the marks is formed by cleaving a single mark such that the single mark is split so that two separate marks are formed, only one of which is associated with the semiconductor light emitting device.

2. A semiconductor light emitting device comprising:
a semiconductor layer including an active layer; and
a first mark with an end arranged in a cleavage face located on a laser light emitting structure including the semiconductor layer, and further wherein there are a plurality of marks at different structure portions of the device that are used in positioning light emitting elements, wherein the first mark identifies a light emission direction and the plurality of marks are at a side of the structure aligned in the light emission direction, comprising a first light emitting device, and a second light emitting device layered on the first light emitting device, wherein:

the first light emitting device includes
- a stripe-shaped first light emitting device section and a stripe-shaped second light emitting device section that are formed in parallel with each other on a first substrate, and
- a stripe-shaped first electrode and a stripe-shaped second electrode that separately supply current to the first light emitting device section and the second light emitting device section;

the second light emitting device includes
- a stripe-shaped third light emitting device section including the semiconductor layer formed on an opposed face side of a second substrate arranged oppositely to the first substrate,
- a stripe-shaped third electrode that supplies current to the third light emitting section,
- a stripe-shaped first opposed electrode and a stripe-shaped second opposed electrode that are respectively arranged oppositely to the first electrode and the second electrode, are respectively and electrically connected to the first electrode and the second electrode, and are connected in parallel with each other,
- a first connection pad and a second connection pad that are respectively and electrically connected to the first opposed electrode and the second opposed electrode,
- a third connection pad electrically connected to the third electrode, and
- the first mark.

3. The semiconductor light emitting device according to claim 2, wherein the first connection pad, the second connection pad, and the third connection pad are arranged side by side in a stripe-shaped region in parallel with the first opposed electrode, and
- a second mark is provided between the first connection pad and the second connection pad, and between the second connection pad and the third connection pad.

4. The semiconductor light emitting device according to claim 2, wherein the first connection pad, the second connection pad, and the third connection pad are arranged side by side in a stripe-shaped region in parallel with the first opposed electrode, and
- a pair of second marks arranged to sandwich the first connection pad, the second connection pad, and the third connection pad in a parallel direction is provided.

* * * * *